United States Patent
Li (10) Patent No.: US 12,316,277 B2
(45) Date of Patent: May 27, 2025

(54) LOW POWER MODE CONTROL MODULE AND METHOD FOR CRYSTAL OSCILLATOR, AND CIRCUIT USING THE SAME

(71) Applicant: NUVOTON TECHNOLOGY CORPORATION, Hsinchu (TW)

(72) Inventor: Wen-Yi Li, Zhubei (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 31 days.

(21) Appl. No.: 18/543,639

(22) Filed: Dec. 18, 2023

(65) Prior Publication Data
US 2025/0030382 A1    Jan. 23, 2025

(30) Foreign Application Priority Data
Jul. 17, 2023    (TW) .................................. 112126584

(51) Int. Cl.
*H03B 5/36*    (2006.01)
*H03B 5/04*    (2006.01)

(52) U.S. Cl.
CPC .............. *H03B 5/364* (2013.01); *H03B 5/04* (2013.01); *H03B 2200/0082* (2013.01)

(58) Field of Classification Search
CPC . H03B 5/364; H03B 5/04; H03B 5/06; H03B 2200/0082
See application file for complete search history.

(56) References Cited

U.S. PATENT DOCUMENTS

2019/0006991 A1*    1/2019   Marques ................ H03B 5/366

* cited by examiner

*Primary Examiner* — Jeffrey M Shin
(74) *Attorney, Agent, or Firm* — Muncy, Geissler, Olds & Lowe, P.C.

(57) ABSTRACT

A low power mode control module for a crystal oscillator which performs the following steps: detecting whether an oscillation output signal of the crystal oscillator is output stably; when the oscillation output signal of the crystal oscillator is output stably, comparing at least one of an oscillation input signal and the oscillation output signal with an amplitude control signal to determine whether to adjust the amplitude control signal; when the amplitude control signal does not need to be adjusted, generating an upper bound reference voltage and a lower bound reference voltage associated with the amplitude control signal; and according to whether the oscillation output signal exceeds a reference voltage range of the upper reference voltage and the lower reference voltage, generating a low power mode control output signal associated with a crystal oscillator enable signal for enabling the crystal oscillator.

10 Claims, 7 Drawing Sheets

LOW POWER MODE CONTROL MODULE AND METHOD FOR CRYSTAL OSCILLATOR, AND CIRCUIT USING THE SAME

BACKGROUND

1. Field of the Invention

The present invention relates to a low-power mode control module, a method and a circuit system using the same for a crystal oscillator, and more particularly, to a low-power mode control module, a method and a circuit system using the same for a crystal oscillator, which are immune to the manufacturing process, system voltage or environmental temperature.

2. Description of the Related Art

The low-power crystal oscillator module is a necessary component for integrated circuits, which generates oscillation signals as clocks through crystal oscillator. The low-power crystal oscillator module is equipped with a controller, which controls the enabling and disabling of the crystal oscillator, thus reducing the power consumption. In a related art technique, the controller mainly detects the amplitude of the oscillation input signal and the oscillation output signal of the crystal oscillator as the basis for enabling and disabling the crystal oscillator.

However, since the amplitudes of the oscillation input signal and the oscillation output signal of the crystal oscillator are vulnerable to the process, system voltage or ambient temperature, it is more difficult for the controller to detect the amplitudes of the oscillation input signal and the oscillation output signal. In other words, if the variation of process, system voltage or ambient temperature cannot be compensated, the detection result of the controller will be incorrect, and the controller will thus mistakenly enable or disable the crystal oscillator.

SUMMARY

As can be understood from the above description, the objective of present invention is to provide a low-power mode control module, a method and a circuit system using the same for a crystal oscillator, which are not affected by the manufacturing process, system voltage or ambient temperature. In other words, when the oscillation output signal of the crystal oscillator is affected by the process, system voltage or ambient temperature, the amplitude control signal used to generate the upper reference voltage and the lower reference voltage will be adjusted accordingly, so as to avoid enabling or disabling the crystal oscillator by mistake.

In order to solve the above-mentioned conventional problems, an embodiment of the present invention provides a low-power mode control module for a crystal oscillator, which comprises a stable output detector, an amplitude detector, a programmable reference voltage generator, and a low-power mode controller. The stable output detector is configured to detect whether an oscillation output signal of the crystal oscillator is stable output. The amplitude detector is electrically connected to the stable output detector, and compares an amplitude control signal with at least one of an oscillation input signal and the oscillation output signal of the crystal oscillator when the oscillation output signal is stable output, so as to determine whether it is necessary to adjust the amplitude control signal. The programmable reference voltage generator is electrically connected to the amplitude detector, and generates an upper-bound reference voltage and a lower-bound reference voltage associated with the amplitude control signal when the amplitude detector determines not to adjust the amplitude control signal. The low-power mode controller is electrically connected to the programmable reference voltage generator, and configured to generate a low-power mode control output signal associated with a crystal oscillator enabling signal for enabling the crystal oscillator according to whether the oscillation output signal exceeds a reference voltage range of the upper reference voltage and the lower reference voltage.

Based on the above objective, the present invention further provides a circuit system, which comprises a crystal oscillator, the aforementioned low-power mode control module, and a function circuit. The low-power mode control module is electrically connected to the crystal oscillator. The function circuit is electrically connected to the crystal oscillator, and configured to receive an oscillation output signal as a clock used by the function circuit during operation.

Based on the above objective, the present invention further provides a low-power mode control method for a crystal oscillator, which comprises the following steps: detecting whether an oscillation output signal of the crystal oscillator is stable output: comparing an amplitude control signal with at least one of an oscillation input signal and an oscillation output signal of the crystal oscillator when the oscillation output signal is stable output, so as to determine whether to adjust the amplitude control signal: generating an upper-bound reference voltage and a lower-bound reference voltage associated with the amplitude control signal when the amplitude control signal is determined not to be adjusted; and generating a low-power mode control output signal associated with a crystal oscillator enabling signal for enabling the crystal oscillator according to whether the oscillation output signal exceeds a reference voltage range of the upper reference voltage and the lower reference voltage.

To sum up, according to the low-power mode control module, method and circuit system using the same, the output signal of low-power mode control will not be vulnerable to the influence of process, system voltage or ambient temperature, so that the crystal oscillator can be prevented from being enabled or disabled by mistake.

BRIEF DESCRIPTION OF THE DRAWINGS

In order to allow the abovementioned and other purposes, features, advantages and embodiments of the present disclosure to be more clearly understood, the accompanying drawings are described as following.

DESCRIPTION OF THE PREFERRED EMBODIMENTS

In order to solve the technical problems encountered in the prior art, the low-power mode control module, the method and the circuit system using the same provided in the embodiments of the present invention are used to determine the amplitude of the oscillation output signal by adjusting the amplitude control signal when the oscillation output signal of the crystal oscillator is stable, after the amplitude of the oscillation output signal is determined, there is no need for adjusting the amplitude control signal. Then, when it is determined that it is not necessary to adjust the amplitude control signal, the upper-bound reference voltage and the lower-bound reference voltage can be generated using the amplitude control signal, and the crystal oscillator can be enabled or disabled according to whether the oscillation output signal is greater than the upper-bound reference voltage or less than the lower-bound reference voltage. Because the amplitude of the oscillation output signal will be constantly monitored, when the oscillation output signal changes due to the variation of process, system voltage or ambient temperature, the amplitude control signal will be adjusted accordingly, and the upper reference voltage and the lower reference voltage will also be adjusted accordingly, so that the crystal oscillator will not be enabled or disabled by mistake due to the influence of process, system voltage or ambient temperature.

Figure 1:
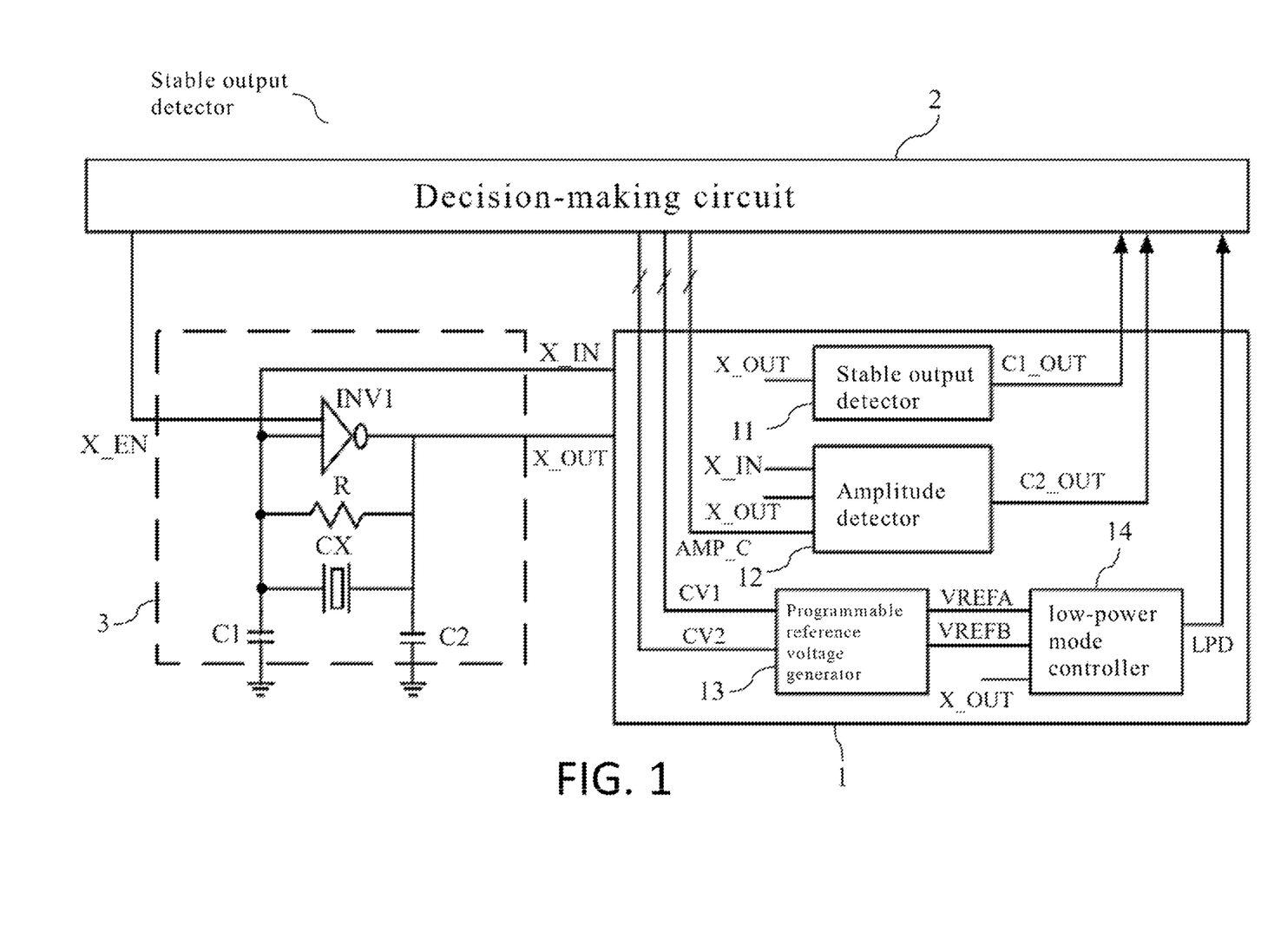
FIG. 1 is a schematic diagram of a low-power mode control module according to an embodiment of the present invention.

Referring to FIG. 1, which is a schematic diagram of a low-power mode control module according to an embodiment of the present invention. The low-power mode control module includes at least a control core 1, and may further include a determination circuit 2, wherein the control core 1 and the determination circuit 2 are electrically connected with each other, and the crystal oscillator 3 is electrically connected with the control core 1 and the determination circuit 2. The control core 1, the determination circuit 2 and the crystal oscillator 3 can form a circuit system together with a function circuit (not shown). The function circuit is electrically connected with the crystal oscillator and is used for receiving an oscillation output signal as a clock used when the function circuit is running.

The control core 1 includes a stable output detector 11, an amplitude detector 12, a programmable reference voltage generator 13, and a low-power mode controller 14. The stable output detector 11 is used to detect whether the oscillation output signal X_OUT of the crystal oscillator 3 is stable output. The amplitude detector 12 is electrically connected to the stable output detector 11 through the determination circuit 2, and is used to compare the amplitude control signal AMP_C with at least one of the oscillation input signal X_IN and the oscillation output signal X_OUT of the crystal oscillator 3 when the oscillation output signal X_OUT is stable output, for the amplitude detector 12 to determine whether to adjust the amplitude control signal AMP_C. In this embodiment, the amplitude detector 12 compares both the oscillation input signal X_IN and the oscillation output signal X_OUT with the amplitude control signal AMP_C, but the present invention is not limited thereto.

Further, the amplitude control signal AMP_C defines a swing range, and the amplitude detector 12 determines whether the swings of the oscillating input signal X_IN and the oscillating output signal X_OUT exceed the swing range or not; and if not, adjust the amplitude control signal AMP_C to increase the swing range until the swings of the oscillating input signal X_IN and the oscillating output signal X_OUT are beyond the swing range. If both the swings of the oscillation input signal X_IN and the oscillation output signal X_OUT is larger than the previous amplitude, the current control signal AMP_C is taken as the target control signal and be used later for generating the upper-bound reference voltage VREFA and the lower-bound reference voltage VREFB. That is, the amplitudes of both the oscillating input signal X_IN and the oscillating output signal X_OUT are constantly monitored to adjust the upper reference voltage VREFA and the lower reference voltage VREFB in real time.

The programmable reference voltage generator 13 is electrically connected to the amplitude detector 12 through the determination circuit 2, and is used to generate an upper-bound reference voltage VREFA and a lower-bound reference voltage VREFB associated with the amplitude control signal AMP_C when there is no need for adjusting the amplitude control signal AMP_C. The low-power mode controller 14 is electrically connected to the programmable reference voltage generator 13, and is used for generating a low-power mode control output signal LPD related to the crystal oscillator enable signal X_EN for enabling the crystal oscillator 3 according to whether the oscillation output signal X_OUT exceeds the reference voltage range of the upper reference voltage VREFA and the lower reference voltage VREFB (i.e., according to whether the oscillation output signal X_OUT is greater than the upper reference voltage VREFA or less than the lower reference voltage VREFB).

The stable output detector 11 generates a first interpretation signal C1_OUT according to whether the oscillation output signal X_OUT is stable output, and the amplitude detector 12 combines at least one of the oscillation output signal X_OUT and the oscillation input signal X_IN with the amplitude control signal AMP_C to generate a second interpretation signal C2_OUT. The determination circuit 3 is used for receiving the first interpretation signal C1_OUT, the second interpretation signal C2_OUT and the low-power mode control output signal LPD, and outputting an amplitude control signal AMP_C, an upper-bound reference voltage control signal CV1 for determining the upper-bound reference voltage VREFA, a lower-bound reference voltage control signal CV2 for determining the lower-bound reference voltage VREFB, and a crystal oscillator enable signal X_EN.

Further, the determination circuit 2 outputs the amplitude control signal AMP_C when the first interpretation signal C1_OUT indicates that the oscillation output signal X_OUT is stable output. The determination circuit 2 adjusts the amplitude control signal AMP_C when the second interpretation signal C2_OUT remains unchanged for at least a predetermined time, wherein the predetermined time is equal to the oscillation period of the oscillation output signal X_OUT or the oscillation input signal X_IN. When the amplitude detector 12 determines not to adjust the amplitude control signal AMP_C, the determination circuit 2 calculates the upper-bound reference voltage VREFA and the lower-bound reference voltage VREFB according to the amplitude control signal AMP_C, and generates the upper-bound reference voltage control signal CV1 and the lower-bound reference voltage control signal CV2 accordingly. The determination circuit 2 generates the crystal oscillator enable signal X_EN according to the low-power mode control output signal LPD.

In this embodiment, the crystal oscillator 3 includes a controllable inverter INV1, a resistor R, an oscillating crystal CX, a first capacitor C1 and a second capacitor C2. The controllable inverter INV1 is enabled according to the crystal oscillator enable signal X_EN, and when being enabled, it performs inverse logic operation on the oscillation input signal X_IN to generate the oscillation output signal X_OUT, that is, the phase of the oscillation input signal X_IN is inverse to that of the oscillation output signal X_OUT. The two ends of the resistor R are electrically connected with the input end and the output end of the controllable inverter INV1, respectively. The two ends of the oscillating crystal CX are electrically connected with the input end and the output end of the controllable inverter INV1, respectively. The two ends of the first capacitor C1 are electrically connected with the input end of the controllable inverter INV1 and a low voltage (for example, ground voltage), respectively. The two ends of the second capacitor C2 are respectively electrically connected with the output end of the controllable inverter INV1 and a low voltage (e.g., the ground voltage). It should be noted that the implementation mode of the crystal oscillator 3 described above is not meant to limit the present invention. In other embodiments, the crystal oscillator 3 can be implemented in other ways.

Figure 2:
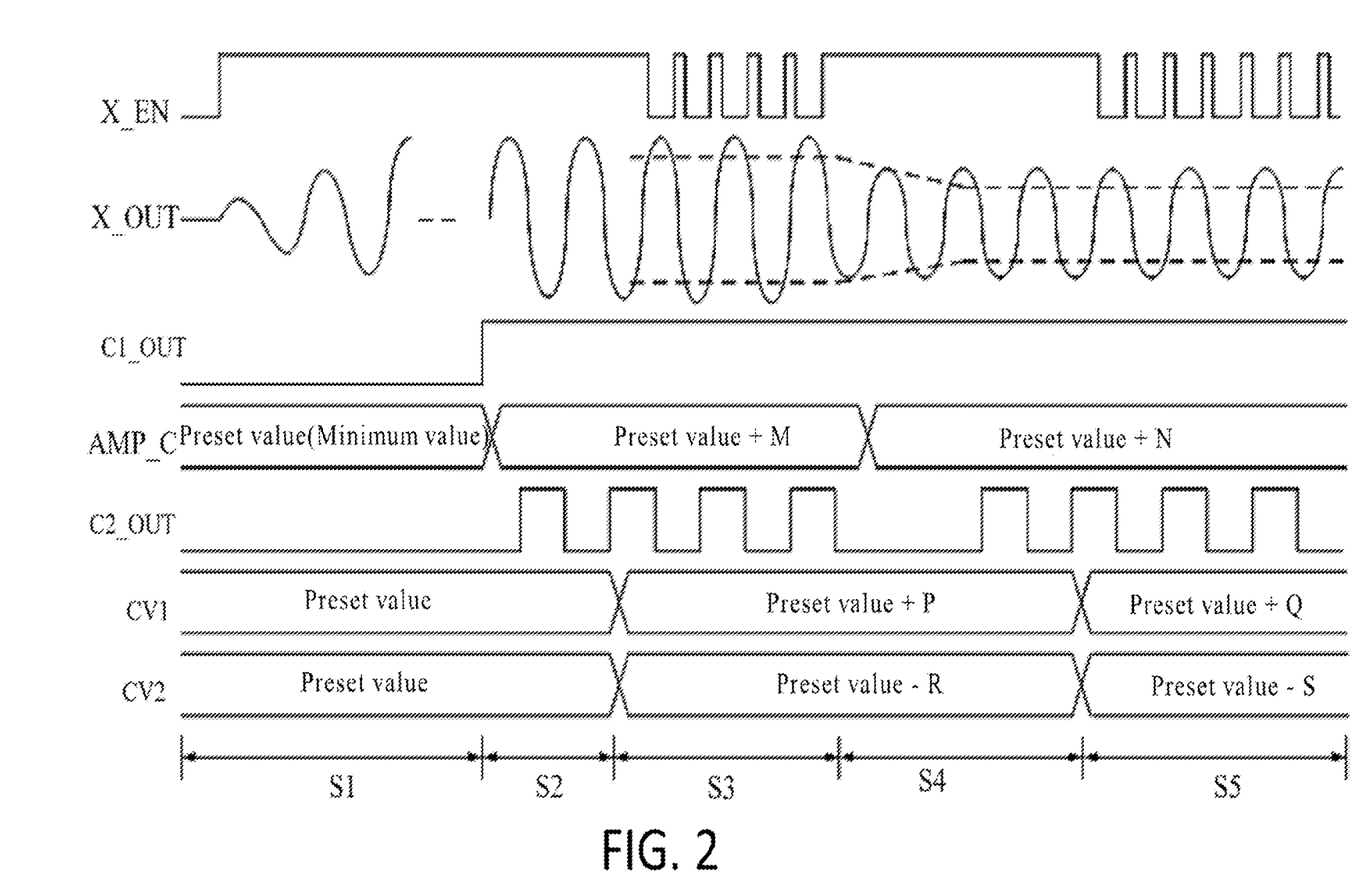
FIG. 2 is a diagram illustrating the waveforms of a plurality of signals in a low-power mode control module according to an embodiment of the present invention.

Please refer to FIG. 1 and FIG. 2 at the same time. FIG. 2 is a diagram illustrating the waveforms of a plurality of signals in a low-power mode control module according to an embodiment of the present invention. The low-power mode control module will first operate in the first time-interval S1. In the first time-interval S1, the crystal oscillator enable signal X_EN is at a logic-high level, thereby enabling the crystal oscillator 3. When the crystal oscillator 3 is initially enabled, its oscillation output signal X_OUT is unstable, so that the first interpretation signal C1_OUT is at a logic-low level. In addition, in the first time-interval S1, the preset value of the amplitude control signal AMP_C is the minimum value.

After the oscillation output signal X_OUT is stable output, the first interpretation signal C1_OUT will become a logic-high level, and the low-power mode control module will enter the second time-interval S2 to operate. In the second time-interval S2, when the amplitude control signal AMP_C is adjusted to the preset value plus M, the amplitude detector 12 determines not to adjust the amplitude control signal AMP_C (e.g., when the amplitude control signal AMP_C is the preset value plus (M+1), the second interpretation signal C2_OUT will not change for at least a predetermined period of time, while when the amplitude control signal AMP_C is the preset value plus M, the second interpretation signal C2_OUT constantly changes with an oscillation period, in which M is a positive integer.

Next, the low-power mode control module enters the third time-interval S3, and the upper reference voltage control signal CV1 and the lower reference voltage control signal CV2 will be respectively set to a preset value plus P and a preset value minus R according to the amplitude control signal AMP_C (P and R are positive integers), so as to determine the upper reference voltage VREFA and the lower reference voltage VREFB, and allow the low-power mode controller 14 to enter the low-power mode for generating a low-power mode control output signal LPD associated with the crystal oscillator enable signal X_EN for enabling the crystal oscillator 3 according to whether the oscillation output signal X_OUT exceeds the reference voltage ranges of the upper reference voltage VREFA and the lower reference voltage VREFB.

Next, the low-power mode control module enters the fourth time-interval S4. Note that in the fourth time-interval S4, because the swings of the oscillation input signal X_IN and the oscillation output signal X_OUT become smaller due to the variation of process, system voltage or ambient temperature, the second interpretation signal C2_OUT will not change for at least a predetermined time, so the determination circuit 2 may adjust the amplitude control signal AMP_C to make the corresponding swing range smaller until the amplitude detector 12 determines not to adjust the amplitude control signal AMP_C. In this embodiment, the amplitude control signal AMP_C is adjusted to a preset value plus n, where n is a positive integer.

The low-power mode control module then enters the fifth time-interval S5 for operation. In the fifth time-interval S5, the upper-bound reference voltage control signal CV1 and the lower-bound reference voltage control signal CV2 are set to a preset value plus Q and minus S according to the amplitude control signal AMP_C, where Q and S are positive integers, so as to determine the upper-bound reference voltage VREFA and the lower-bound reference voltage VREFB, and allow the low-power mode controller 14 to enter the low-power mode for generating a low-power mode control output signal LPD associated with the crystal oscillator enable signal X_EN for enabling the crystal oscillator 3 according to whether the oscillation output signal X_OUT exceeds the reference voltage ranges of the upper reference voltage VREFA and the lower reference voltage VREFB.

Figure 3:
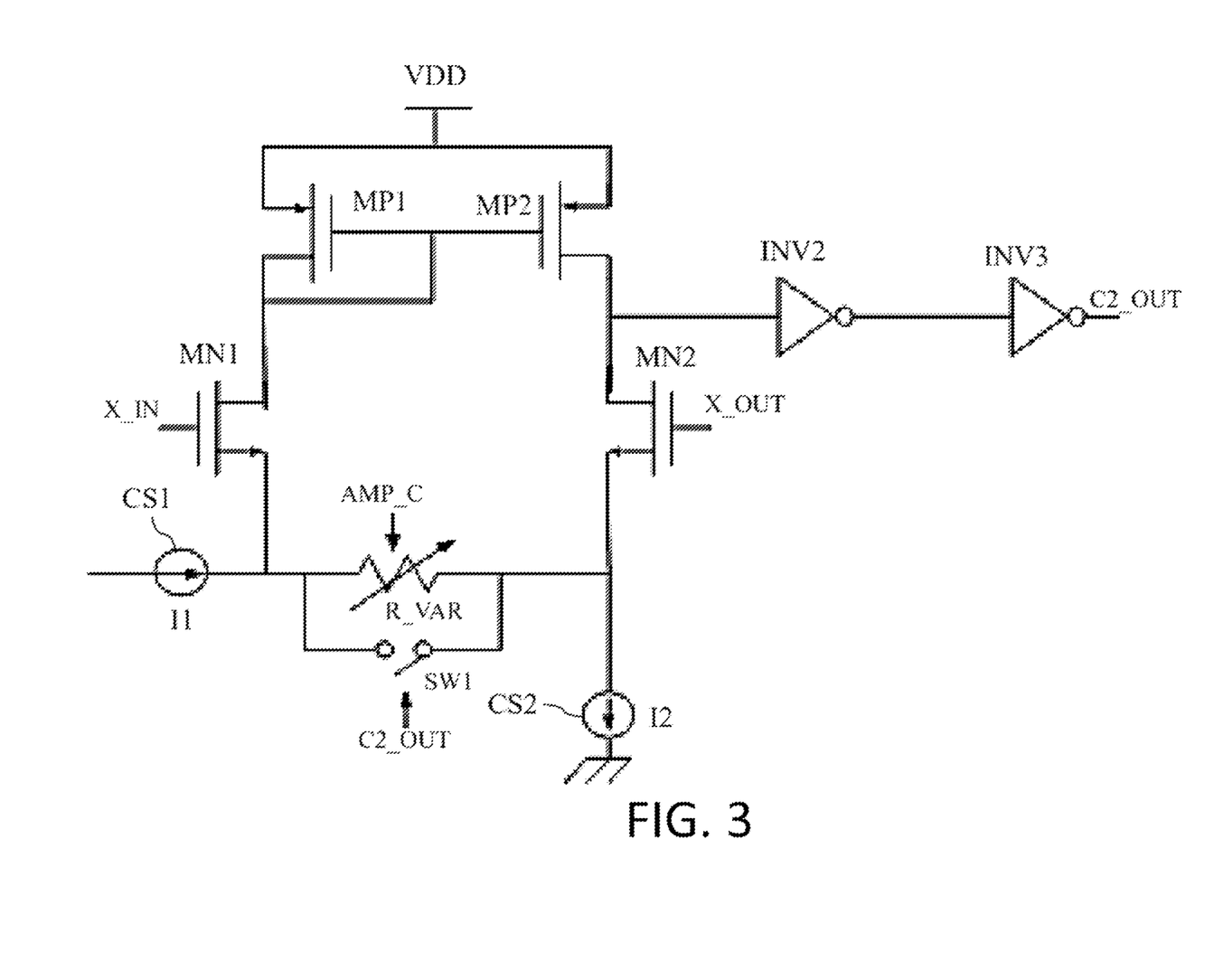
FIG. 3 is a schematic diagram of an amplitude detector of a low-power mode control module according to an embodiment of the present invention.

Please refer to FIGS. 1 and 3. FIG. 3 is a schematic diagram of an amplitude detector of a low-power mode control module according to an embodiment of the present invention. FIG. 3 is one of the implementations of the amplitude detector 12 in FIG. 1, but the present invention is not limited thereto. The amplitude detector 12 includes a first P-type transistor MP1, a second P-type transistor MP2, a first N-type transistor MN1, a second N-type transistor MN2, a first inverter INV2, a second inverter INV3, a switch SW1, a voltage-controlled resistance element R_VAR, a first current source CS1, and a second current source CS2.

The source of the first P-type transistor MP1 and the source of the second P-type transistor MP2 are electrically connected to the system voltage VDD. The gate of the first P-type transistor MP1 is electrically connected to the gate of the second P-type transistor MP2. The drain of the first P-type transistor MP1 is electrically connected to the drain of the second N-type transistor MN2. The gate of the first N-type transistor MN1 is connected with the drain of the first N-type transistor MN1.

The input end of the first inverter INV2 is electrically connected to the drain of the second N-type transistor MN2, and the output end of the first inverter INV2 is electrically connected to the input end of the second inverter INV3. The first current source CS1 and the second current source CS2 are used to provide a first current I1 and a second current I2, respectively. The first current source CS1 is electrically connected to the source of the first N-type transistor MN1, and the second current source CS2 is electrically connected to the source of the second N-type transistor MN2.

The switch SW1 is electrically connected between the source of the first N-type transistor MN1 and the source of the second N-type transistor MN2, and is turned on or off by the output signal (i.e., the second interpretation signal C2_OUT) at the output end of the second inverter INV3, which is the second interpretation signal C2_OUT. The switch SW1 is set to avoid the delay of the second interpretation signal C2_OUT, such that it is necessary to make a short circuit between the source of the first N-type transistor MN1 and the source of the second N-type transistor MN2 when the second interpretation signal C2_OUT is at a logic-high level.

The voltage-controlled resistance element R_VAR is electrically connected between the source of the first N-type transistor MN1 and the source of the second N-type transistor MN2, and the resistance value thereof is determined according to the amplitude control signal AMP_c. The first current I1 is provided to one end of the first N-type transistor MN1 and the voltage-controlled resistor element R_VAR electrically connected with the switch SW1, and the second current I2 is provided to one end of the second N-type transistor MN2 and the voltage-controlled resistor element R_VAR electrically connected with the switch SW1. When the oscillation output signal X_OUT is less than the oscillation input signal X_IN, the second interpretation signal C2_OUT is at a logic-high level, and when the oscillation output signal X_OUT is greater than the oscillation input signal X_IN, the second interpretation signal C2_OUT is at a logic-low level.

The voltage across the voltage-controlled resistor element R_VAR is VAMP, in which VAMP=$\{[(I2-I1)/2]+I1\}*R$, where R is the resistance value of the voltage-controlled resistor element R_VAR, which is determined by the amplitude control signal AMP_C. When the amplitude control signal AMP_C makes the voltage across the voltage-controlled resistor element R_VAR to be VAMP (i.e., the aforementioned swing range) larger than the swings of the oscillation output signal X_OUT and the oscillation input signal X_IN, the second interpretation signal C2_OUT will not oscillate for at least a predetermined period of time, that is, it will not form a clock waveform that oscillates with an oscillation period. On the other hand, the voltage-controlled resistor element R_VAR can be changed into a fixed resistor, and the first current I1 and the second current I2 are controlled by the amplitude control signal AMP_C, so as to change the cross voltage to be VAMP.

Figure 4:
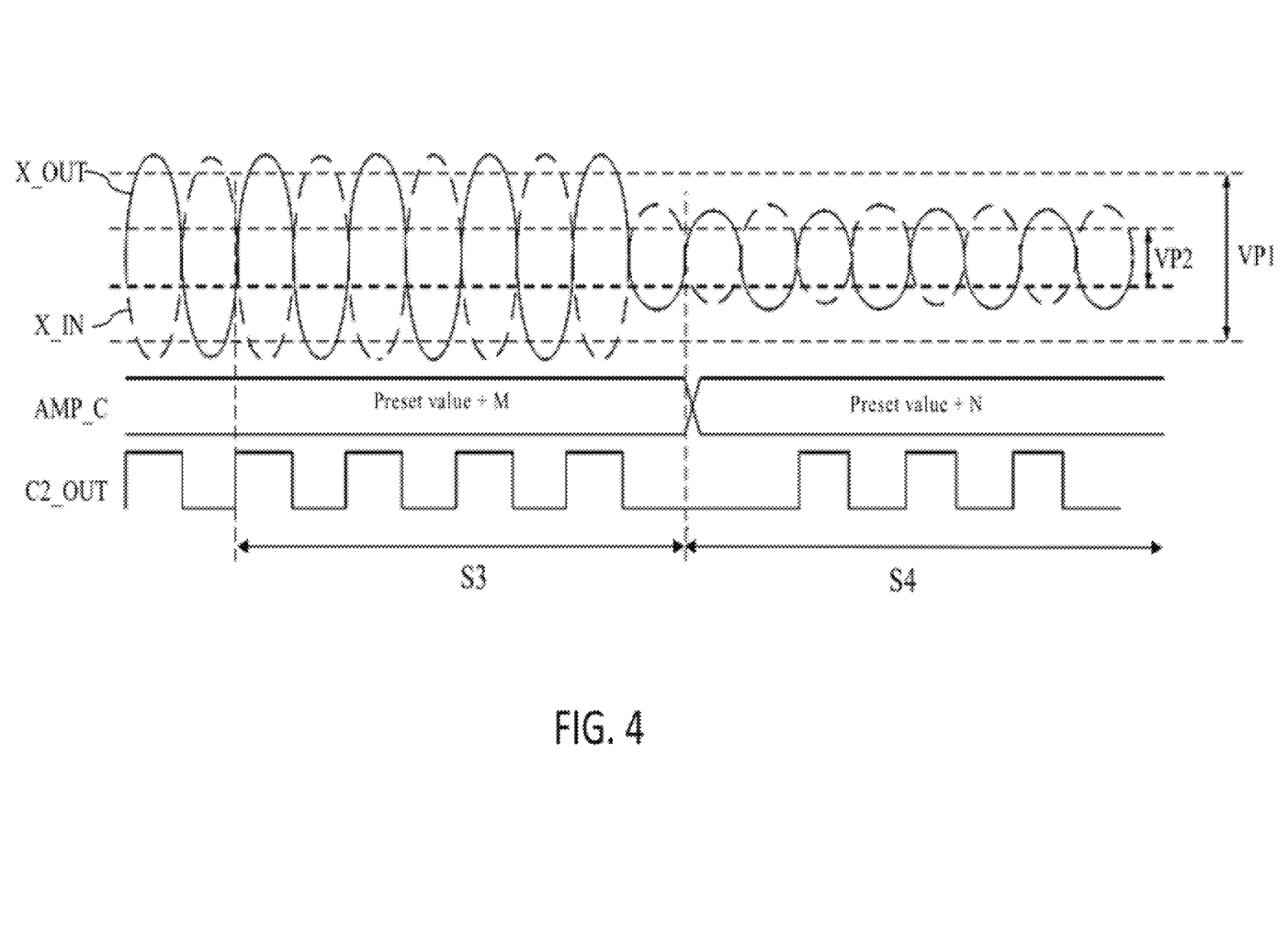
FIG. 4 is a diagram illustrating the waveforms of a plurality of signals in the amplitude detector of the low-power mode control module according to the embodiment of the present invention.

Please refer to FIGS. 1 to 4. FIG. 4 is a diagram illustrating the waveforms of a plurality of signals in the amplitude detector of the low-power mode control module according to the embodiment of the present invention. In the third time-interval S3, the amplitude control signal AMP_C is a preset value plus M, and the amplitude detector 12 determines not to adjust the amplitude control signal AMP_C. When the voltage across the voltage-controlled resistor element R_VAR is the first swing VP1, the second interpretation signal C2_OUT will oscillate with an oscillation period. However, in the fourth time-interval S4, the oscillation amplitudes of the oscillation input signal X_IN and the oscillation output signal X_OUT become smaller due to the variation of process, system voltage or ambient temperature, and the oscillation amplitudes of the oscillation input signal X_IN and the oscillation output signal X_OUT are smaller than the voltage-controlled resistance element R_VAR's cross voltage VAMP (i.e., the first oscillation amplitude VP1). The determination circuit 2 adjusts the amplitude control signal AMP_C so that the cross voltage VAMP of the voltage-controlled resistor element R_VAR becomes smaller. When the cross voltage VAMP is adjusted to the second swing VP2, the second interpretation signal C2_OUT oscillates with an oscillation period, and the amplitude detector 12 determines not to adjust the amplitude control signal AMP_C.

Figure 5:
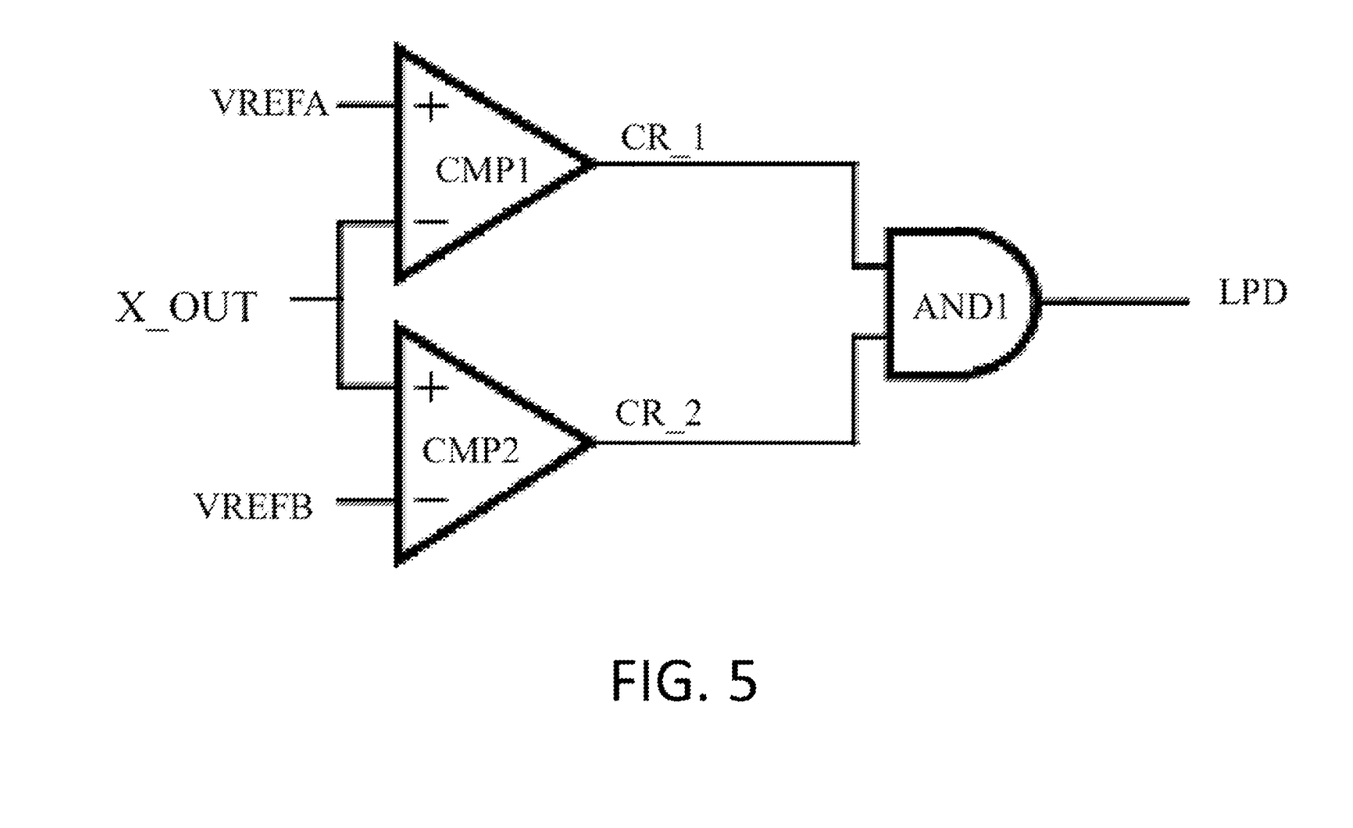
FIG. 5 is a schematic diagram of a low-power mode controller of a low-power mode control module according to an embodiment of the present invention.

Please refer to FIG. 1 and FIG. 5. FIG. 5 is a schematic diagram of a low-power mode controller of a low-power mode control module according to an embodiment of the present invention. FIG. 5 shows one of various implementations of the low-power mode controller 14 of FIG. 1, but the present invention is not limited thereto. The low-power mode controller 14 includes a first comparator CMP1, a second comparator CMP2 and a logic gate AND1. The first comparator CMP1 is used to compare the oscillation output signal X_OUT with the upper-bound reference voltage VREFA to output a first comparison result signal CR1. The second comparator CMP2 is used to compare the oscillation output signal X_OUT with the lower-bound reference voltage VREFB to output a second comparison result signal CR2. The logic gate AND1 is an AND gate in this embodiment, which is electrically connected with the first comparator CMP1 and the second comparator CMP2, and is used for performing a logical operation (e.g., a logical AND operation as shown in this embodiment) on the first comparison result signal CR1 and the second comparison result signal CR2 to generate the low-power mode control output signal LPD.

Figure 6:
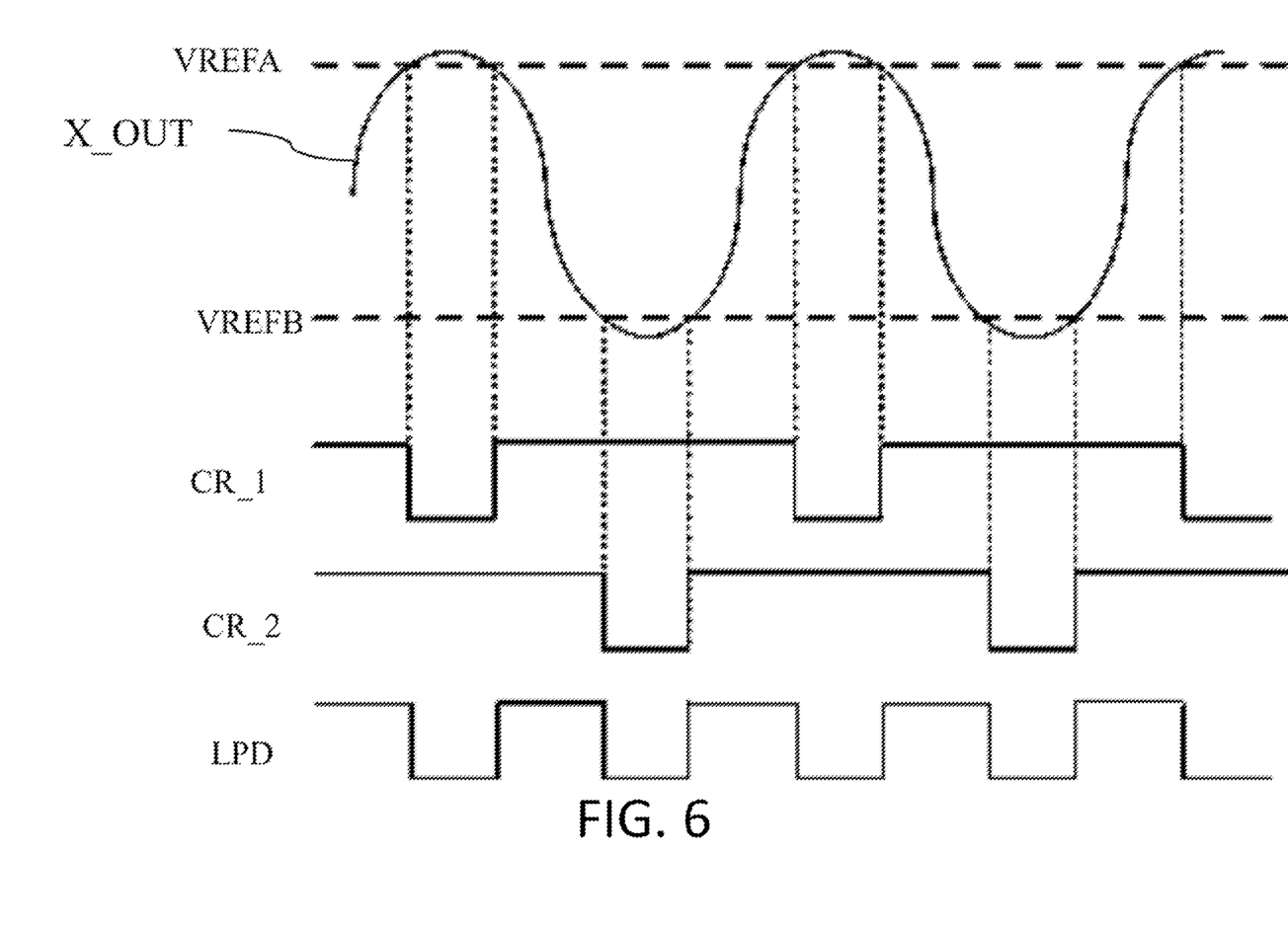
FIG. 6 is a diagram illustrating the waveforms of multiple signals of the low-power mode controller of the low-power mode control module according to the embodiment of the present invention.

Please refer to FIGS. 5 and 6. FIG. 6 is a diagram illustrating the waveforms of multiple signals of the low-power mode controller of the low-power mode control module according to the embodiment of the present invention. In this example, when the oscillation output signal X_OUT is greater than the upper-bound reference voltage VREFA, the first comparison result signal CR1 becomes a logic-low level, so that the low-power mode control output signal LPD becomes a logic-low level. When the oscillation output signal X_OUT is less than the lower-bound reference voltage VREFB, the second comparison result signal CR2 becomes a logic-low level, so that the low-power mode control output signal LPD becomes a logic-low level.

Figure 7:
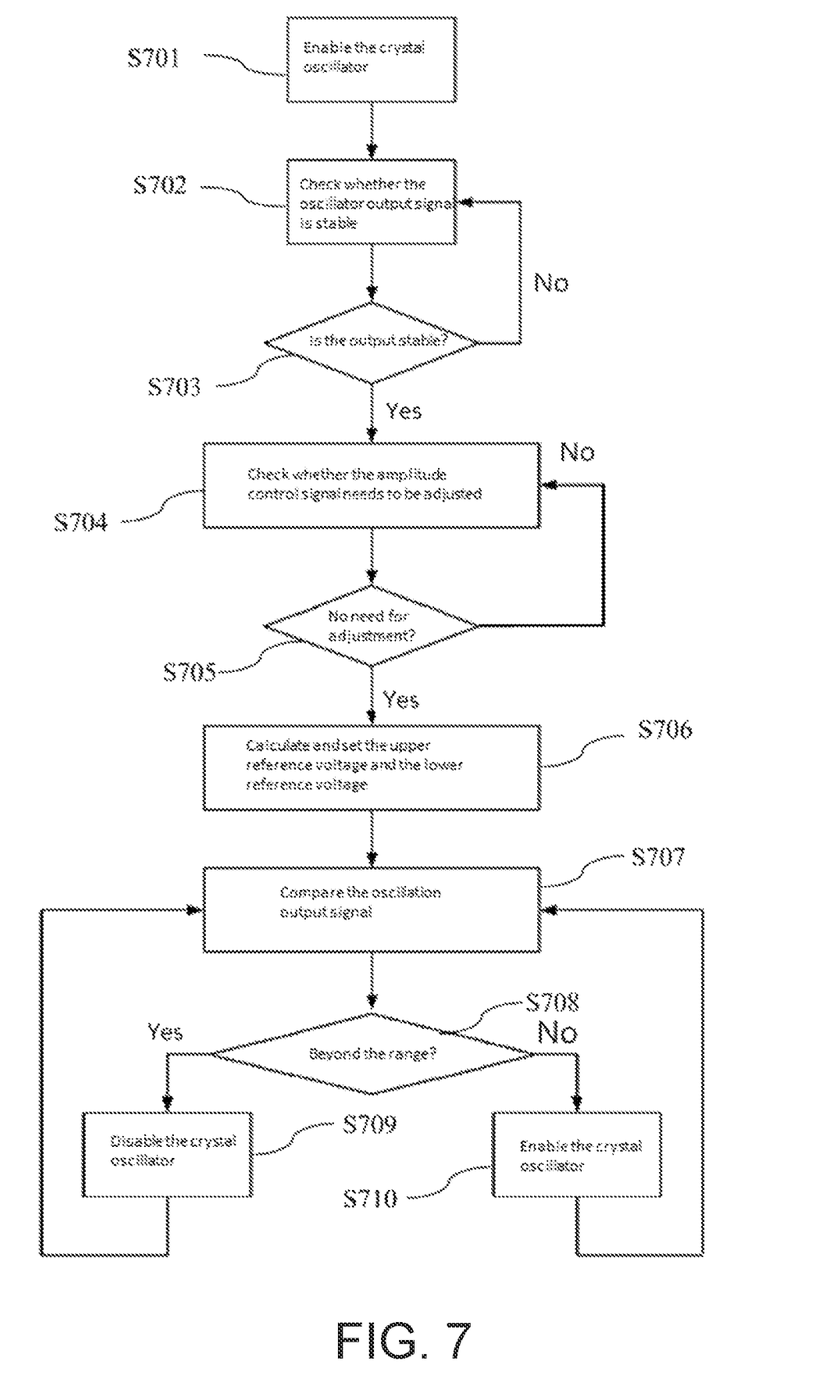
FIG. 7 is a flowchart illustrating a low-power mode control method according to an embodiment of the present invention.

Finally, please refer to FIG. 1 and FIG. 7. FIG. 7 is a flowchart illustrating a low-power mode control method according to an embodiment of the present invention. In Step S701, the crystal oscillator 3 is enabled to start the crystal oscillator 3. Next, in Step S702, it is checked whether the output of the oscillation output signal X_OUT is stable. In Step S703, it is determined whether the output of the oscillating output signal X_OUT is stable. If the output of the oscillating output signal X_OUT is stable, Step S704 is executed, otherwise, the process goes to Step S702.

In Step S704, it is determined whether the amplitude control signal AMP_C needs to be adjusted by comparing at least one of the oscillation input signal X_IN and the oscillation output signal X_OUT with the amplitude control signal AMP_C. In Step S705, it is checked whether the amplitude control signal AMP_C needs to be adjusted. If the amplitude control signal AMP_C no longer needs to be adjusted, Step S706 is executed, otherwise, the process goes to Step S704. Please note that Steps S704 and S705 are executed in a permanent manner. Even if Steps S707 to S710 are continuously executed, once the swing of at least one of the oscillation input signal X_IN and the oscillation output signal X_OUT changes, Steps S707 to S710 will be suspended/paused, and Steps S704 and S705 will be executed again.

In Step S706, an upper reference voltage VREFA and a lower reference voltage VREFB are calculated and set according to the amplitude control signal AMP_C. Then, in Step S707, the low-power mode is entered, and the oscillation output signal X_OUT is compared with the upper-bound reference voltage VREFA and the lower-bound reference voltage VREFB. Then, in Step S708, it is determined whether the oscillation output signal X_OUT exceeds the reference voltage ranges of the upper reference voltage VREFA and the lower reference voltage VREFB. If the oscillation output signal X_OUT exceeds the reference voltage range, the flow goes to Step S709: otherwise, Step the flow goes to S710. In Step S709, the crystal oscillator 3 is disabled. In Step S710, the crystal oscillator 3 is enabled. After Steps S709 and S710, as long as the swing of the oscillation output signal X_OUT is not affected, the process goes to Step S706.

To summarize, compared with the prior art, the power mode control module, method and circuit system using the same in the embodiment of the present invention can adjust the upper reference voltage and the lower reference voltage for comparison with the oscillation output signal when the oscillation output signal of the crystal oscillator is affected by the process, system voltage or environmental temperature. Therefore, To sum up, according to the low-power mode control module, method and circuit system using the same, the output signal of low-power mode control will not be vulnerable to the influence of process, system voltage or ambient temperature, so that the crystal oscillator can be prevented from being enabled or disabled by mistake, thus effectively improving the control accuracy.

The present invention is only disclosed in the preferred embodiments herein. However, it should be understood by anyone skilled in the art that the above-mentioned embodiments are only used to describe the present invention, and are not used to limit the scope of patent rights claimed by the present invention. All changes or substitutions that are equal or equivalent to the above embodiments should be interpreted as being included in the spirit or scope of the present invention. Therefore, the scope of protection of the present invention should be based on that defined in the following patent application scope.

What is claimed is:

1. A low-power mode control module for a crystal oscillator, comprising:
    a stable output detector, configured to detect whether an oscillation output signal of the crystal oscillator is outputted stably;
    an amplitude detector, electrically connected to the stable output detector, and configured to compare an amplitude control signal with at least one of an oscillation input signal and the oscillation output signal of the crystal oscillator when the oscillation output signal is outputted stably, to determine whether to adjust the amplitude control signal;
    a programmable reference voltage generator, electrically connected to the amplitude detector, and configured to generate an upper-bound reference voltage and a lower-bound reference voltage associated with the amplitude control signal when the amplitude detector determines not to adjust the amplitude control signal; and
    a low-power mode controller, electrically connected to the programmable reference voltage generator, and configured to generate a low-power mode control output signal associated with a crystal oscillator enabling signal for enabling the crystal oscillator according to whether the oscillation output signal exceeds a reference voltage range of the upper reference voltage and the lower reference voltage.

2. The low-power mode control module according to claim 1, further comprising:
    a determination circuit configured to receive a first interpretation signal, a second interpretation signal and the low-power mode control output signal, and output the amplitude control signal, an upper-bound reference voltage control signal for determining the upper-bound reference voltage, a lower-bound reference voltage control signal for determining the lower-bound reference voltage, and the crystal oscillator enabling signal;
    wherein the stable output detector is electrically connected to the amplitude detector through the determination circuit, the amplitude detector is electrically connected to the programmable reference voltage generator through the determination circuit, the stable output detector generates the first interpretation signal according to whether the oscillation output signal is outputted stably, and the amplitude detector compares at least one of the oscillation output signal and the oscillation input signal with the amplitude control signal to generate the second interpretation signal.

3. The low-power mode control module of claim 2, wherein the determination circuit outputs the amplitude control signal when the first interpretation signal indicates that the oscillation output signal is outputted stable, wherein when the determination circuit adjusts the amplitude control signal when the second interpretation signal is unchanged for at least a predetermined time, wherein the predetermined time is equal to an oscillation period of the oscillation output signal or the oscillation input signal, wherein when the amplitude detector determines not to adjust the amplitude control signal, the determination circuit calculates the upper-bound reference voltage and the lower-bound reference voltage according to the amplitude control signal, and generates the upper-bound reference voltage control signal and the lower-bound reference voltage control signal accordingly, wherein the determination circuit generates the crystal oscillator enabling signal based on the low-power mode control output signal.

4. The low-power mode control module of claim 2, wherein the amplitude detector comprises:
    a first P-type transistor, a second P-type transistor, a first N-type transistor and a second N-type transistor, wherein a source of the first P-type transistor and a source of the second P-type transistor are electrically connected to a system voltage, a gate of the first P-type transistor is electrically connected to a gate of the second P-type transistor, a drain of the first P-type transistor and a drain of the first N-type transistor, a drain of the second P-type transistor is electrically connected to a drain of the second N-type transistor, and a gate of the first N-type transistor and a gate of the second N-type transistor respectively receive the oscillation input signal and the oscillation output signal;
    a first inverter and a second inverter, wherein an input end of the first inverter is electrically connected with the drain of the second N-type transistor, and an output end of the first inverter is electrically connected with an input end of the second inverter;
    a first current source and a second current source are respectively configured to provide a first current and a second current, wherein the first current source is electrically connected with a source of the first N-type transistor, and the second current source is electrically connected with a source of the second N-type transistor;
    a switch, electrically connected between the source of the first N-type transistor and the source of the second N-type transistor, and controlled by an output signal at an output end of the second inverter, wherein the output signal at the output end of the second inverter is the second interpretation signal; and a voltage-controlled resistance element, electrically connected between the source of the first N-type transistor and the source of the second N-type transistor, and configured to determine a resistance value thereof according to the amplitude control signal;

wherein the first current is provided to an end where the first N-type transistor, the voltage-controlled resistor element and the switch are electrically connected, and the second current is provided to an end where the second N-type transistor, the voltage-controlled resistor element and the switch are electrically connected.

5. The low-power mode control module according to claim 2, wherein the low-power mode controller comprises:

a first comparator configured to compare the oscillation output signal with the upper-bound reference voltage to output a first comparison result signal;

a second comparator configured to compare the oscillation output signal with the lower-bound reference voltage to output a second comparison result signal; and a logic gate electrically connected to the first comparator and the second comparator, and configured to perform a logic operation on the first comparison result signal and the second comparison result signal to generate the low-power mode control output signal.

6. The low-power mode control module of claim 2, wherein when the oscillation output signal varies due to a process, a system voltage or an ambient temperature variation, the determination circuit adjusts the amplitude control signal until the amplitude detector determines not to adjust the amplitude control signal.

7. A circuit system comprising:
a crystal oscillator;
the low-power mode control module according to claim 1, electrically connected to the crystal oscillator; and
a function circuit electrically connected to the crystal oscillator, and configured to receive an oscillation output signal as a clock used by the function circuit during operation.

8. The circuit system according to claim 7, wherein the crystal oscillator comprises:

a controllable inverter configured to be enabled according to a crystal oscillator enabling signal, and performs an inverse logic operation on an oscillation input signal to generate the oscillation output signal;

a resistor with two ends electrically connected with an input end and an output end of the controllable inverter, respectively;

an oscillating crystal with two ends electrically connected with the input end and the output end of the controllable inverter, respectively;

a first capacitor, with two ends electrically connected with the input end of the controllable inverter and a low voltage, respectively; and a second capacitor, with two ends electrically connected with the output end of the controllable inverter and the low voltage, respectively.

9. A low-power mode control method for a crystal oscillator, comprising:

detecting whether an oscillation output signal of the crystal oscillator is stable output;

comparing an amplitude control signal with at least one of an oscillation input signal and an oscillation output signal of the crystal oscillator when the oscillation output signal is stable output, so as to determine whether to adjust the amplitude control signal;

generating an upper-bound reference voltage and a lower-bound reference voltage associated with the amplitude control signal when the amplitude detector determines not to adjust the amplitude control signal; and generating a low-power mode control output signal associated with a crystal oscillator enabling signal for enabling the crystal oscillator according to whether the oscillation output signal exceeds a reference voltage range of the upper reference voltage and the lower reference voltage.

10. The low-power mode control method as claimed in claim 9, wherein when the oscillation output signal varies due to a process, a system voltage or an ambient temperature variation, the amplitude control signal is adjusted until the amplitude detector determines not to adjust the amplitude control signal.

* * * * *